US005543644A

United States Patent [19]
Abt et al.

[11] Patent Number: 5,543,644
[45] Date of Patent: Aug. 6, 1996

[54] HIGH DENSITY ELECTRICAL CERAMIC OXIDE CAPACITOR

[75] Inventors: Norman E. Abt, Burlingame; Reza Moazzami, Oakland, both of Calif.; Yoav Nissan-Cohen, Zichren Yaákov, Israel

[73] Assignee: National Semiconductor Corporation, Santa Clara, Calif.

[21] Appl. No.: 410,960

[22] Filed: Mar. 27, 1995

Related U.S. Application Data

[62] Division of Ser. No. 837,271, Feb. 18, 1992, Pat. No. 5,401,680.

[51] Int. Cl.⁶ .................................. H01L 29/78
[52] U.S. Cl. ................. 257/295; 257/296; 257/306; 257/767
[58] Field of Search ................. 257/532, 295, 257/310, 306, 307, 308, 309, 767, 296

[56] References Cited

U.S. PATENT DOCUMENTS

| | | | |
|---|---|---|---|
| 5,005,102 | 4/1991 | Larson | 361/313 |
| 5,006,491 | 4/1991 | Chan et al. | 437/52 |
| 5,046,043 | 9/1991 | Miller et al. | 365/145 |
| 5,116,776 | 5/1992 | Chan et al. | 437/52 |
| 5,119,154 | 6/1992 | Gnadinger | 357/23.6 |
| 5,140,389 | 8/1992 | Kimura et al. | 357/23.6 |
| 5,187,638 | 2/1993 | Sandhu et al. | 257/310 |
| 5,350,705 | 9/1994 | Brassington et al. | 257/295 |
| 5,365,095 | 11/1994 | Shono et al. | 257/295 |
| 5,383,088 | 1/1995 | Chapple-Sokol et al. | 257/310 |
| 5,392,189 | 2/1995 | Fazan et al. | 257/310 |
| 5,416,735 | 5/1995 | Onishi et al. | 257/295 |
| 5,418,388 | 5/1995 | Okudaira et al. | 257/295 |

FOREIGN PATENT DOCUMENTS

| | | |
|---|---|---|
| 469934A | 2/1992 | European Pat. Off. |
| 4107165A | 10/1991 | Germany |

*Primary Examiner*—Robert P. Limanek
*Assistant Examiner*—David B. Hardy
*Attorney, Agent, or Firm*—Limbach & Limbach, L.L.P

[57] ABSTRACT

An electrical ceramic oxide capacitor utilizable in an integrated circuit memory device, and a method for making same is presented. A transistor is fabricated on a semiconductor substrate according to conventional techniques. A diffusion barrier is deposited over the transistor to protect it from subsequent process steps. Metal contacts are formed to contact the active transistor regions in the substrate, and additional barriers are formed to insulate the metal contacts. In a vertical embodiment, the barriers above the metal contacts can serve as bottom electrodes for the capacitor. In a lateral embodiment, the barriers on the side of the metal contacts serve as electrodes for the capacitor. Electrical ceramic oxide material is deposited between the electrode plates.

8 Claims, 9 Drawing Sheets

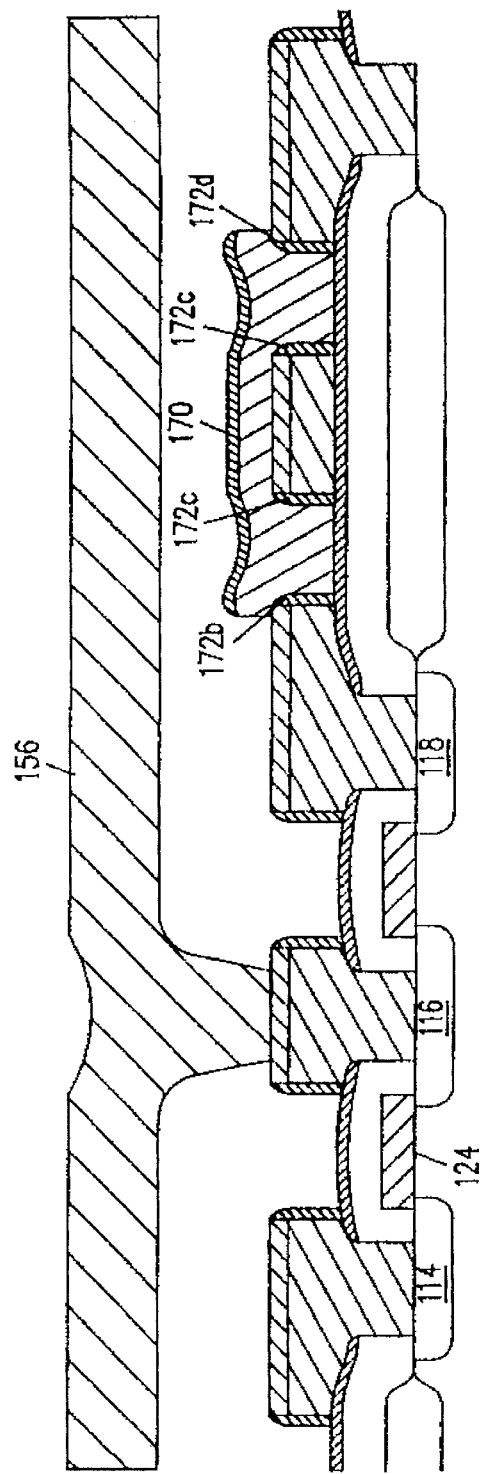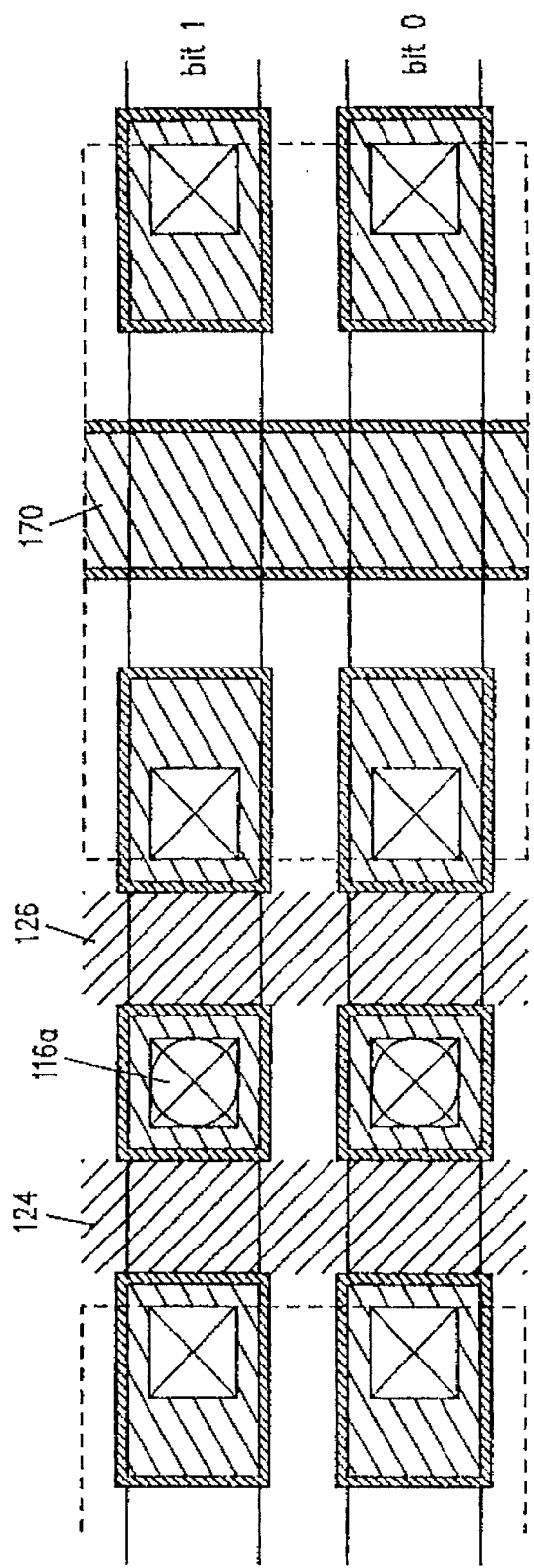

HIGH DENSITY ELECTRICAL CERAMIC OXIDE CAPACITOR

This is divisional of application Ser. No. 07/837,271 filed Feb. 18, 1992, now U.S. Pat. No. 5,401,680.

BACKGROUND OF THE INVENTION

1. Field of the Invention

The present invention relates to integrated circuit memory elements, and more specifically, to fabrication of capacitors utilizing electrical ceramic oxides, such as ferroelectric materials, in such memory elements.

2. Discussion of the Prior Art

The use of ferroelectric materials to build memory cells is generally known. See U.S. Pat. No. 2,695,396 (Anderson). A ferroelectric material (FE) is "a crystalline substance that exhibits spontaneous electric polarization, electric hysteresis, and piezoelectricity." Webster's Seventh New Collegiate Dictionary, p. 308 (1970).

In a typical ferroelectric cell application, capacitors are built having ferroelectric material sandwiched between a pair of electrodes. The ferroelectric polarization characteristic can be represented by a hysteresis loop (polarization vs. applied energy). Therefore, in a steady state condition (no applied energy) the capacitor will be polarized in one direction (representing, for example, a logical 0). The application of an electric field causes a small displacement in the ion orientation of the crystal structure, thus reversing the polarization of the crystal (logical 1).

Ferroelectric capacitors have been combined with integrated circuit technology to provide non-volatile memory devices. See U.S. Pat. No. 4,149,301 (Cook). For example, ferroelectric capacitors have been used in conjunction with dynamic random access memories (DRAM's) to store and refresh a volatile memory cell in a power interrupt mode, sometimes called a "shadow" RAM.

A variety of electrical ceramic oxides exist, such as those used as ferroelectric capacitors for integrated circuit memories (lead titanate, $PbTiO_3$; lead zirconate titanate, "PZT"; lanthanum doped PZT, "PLZT"; and barium titanate, $BaTiO_3$). Electrical ceramic oxides are also used in electro-optical devices ("PLZT"; lithium niobate, $LiNbO_3$; and bismuth titanate, $Bi_4Ti_3O_{12}$) and high temperature superconductors (yttrium barium copper oxide, $YBa_2Cu_3O_7$). The properties of these electrical ceramic oxides are typically optimized by heat treatments in oxidizing ambients at high temperatures (for example, 500° C. to 1100° C.). Many common materials are not suitable for use under such conditions. For example, aluminum melts or reacts with the electrical ceramic oxide material, while tungsten and molybdenum are destructively oxidized. Silicides and polysilicon either react with the electrical ceramic oxides at high temperature or are oxidized at the surface in contact with the electrical ceramic oxide. Silicon dioxide and silicon nitride may also react at these higher temperatures. For these reasons, it has been difficult to build rugged and reliable ferroelectric capacitors on a miniaturized scale appropriate for IC requirements. It has been recognized that homogeneity and uniformity of the ferroelectric region between capacitor plates is important to the ability of the capacitor to retain data (maintain polarization state) as the size of the device gets smaller.

Thus, it would be desirable if a reliable memory cell using a ferroelectric capacitor could be built in the course of integrated circuit fabrication, such that IC operation would be unaffected by the ferroelectric process.

SUMMARY OF THE INVENTION

The present invention provides a method for making an electrical ceramic oxide capacitor for use as a integrated circuit (IC) memory element. In its most general terms, the present invention describes a method for forming an electrical ceramic oxide capacitor over the top of an IC device (i.e., a transistor), wherein a protective diffusion barrier between the capacitor and the transistor prevents the process steps involved in the formation of the electrical ceramic oxide capacitor from altering the active regions of the already-formed transistor. The electrical ceramic oxide capacitor may be oriented either vertically or laterally.

After making the transistor and covering it with a diffusion barrier, metal contacts are formed through the barrier to contact the active regions of the transistor. The metal contacts have exposed sidewalls above the barrier which must also be protected from interaction with the electrical ceramic oxide material. Thus, a second barrier is formed to cover the exposed sidewalls. Electrical ceramic oxide material is then deposited and a final barrier is formed.

In the preferred embodiment, in which a vertical ferroelectric capacitor is formed over the IC, the reaction barrier comprises a barrier electrode formed on top of the metal plugs and spacers formed on the sidewalls of the metal plugs. The barrier electrodes above the first and second drain regions form the bottom electrodes of the capacitor. A layer of ferroelectric material is then deposited on top of the bottom electrodes and a top electrode is formed over the ferroelectric layer in the area above the bottom electrodes.

In the lateral ferroelectric capacitor embodiment, an additional metal plug is formed over the field oxide regions. As in the preferred embodiment, the reaction barrier comprises a barrier electrode formed on top of the metal plugs, and spacers formed on the sides of the metal plugs. However, in the lateral embodiment, the spacers form the capacitor electrodes. A layer of ferroelectric material is deposited on top of the barrier electrodes and between the spacers, and a top barrier is formed over the ferroelectric layer.

Other features and advantages of the present invention will be more fully understood and appreciated upon consideration of the following detailed description of the invention and accompanying drawings which set forth an illustrative embodiment in which the concepts of the invention are utilized.

BRIEF DESCRIPTION OF THE DRAWINGS

FIGS. 2–4a are side plan views of the preferred embodiment of a vertical ferroelectric capacitor according to the present invention.

FIG. 4c is an electrical schematic corresponding to FIG. 4a.

FIGS. 9 and 10a are side plan views of a lateral ferroelectric capacitor according to the present invention.

FIG. 10b is a top plan view of FIG. 10a.

FIG. 10c is an electrical schematic of FIG. 10a.

DETAILED DESCRIPTION OF THE INVENTION

Figure 1A:
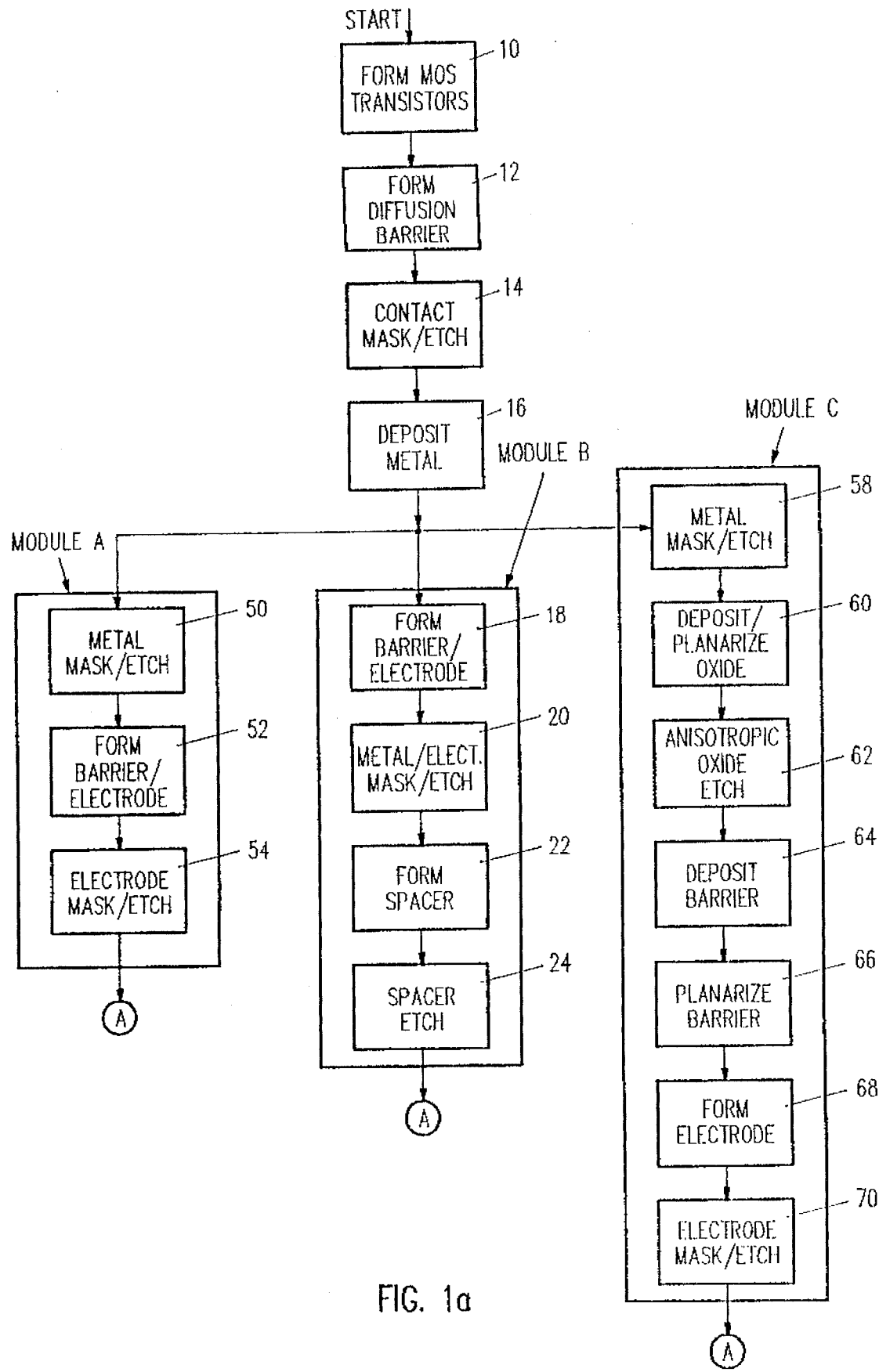
FIGS. 1a and 1b are flow charts illustrating the process steps required to carry out the present invention.
Figure 1B:
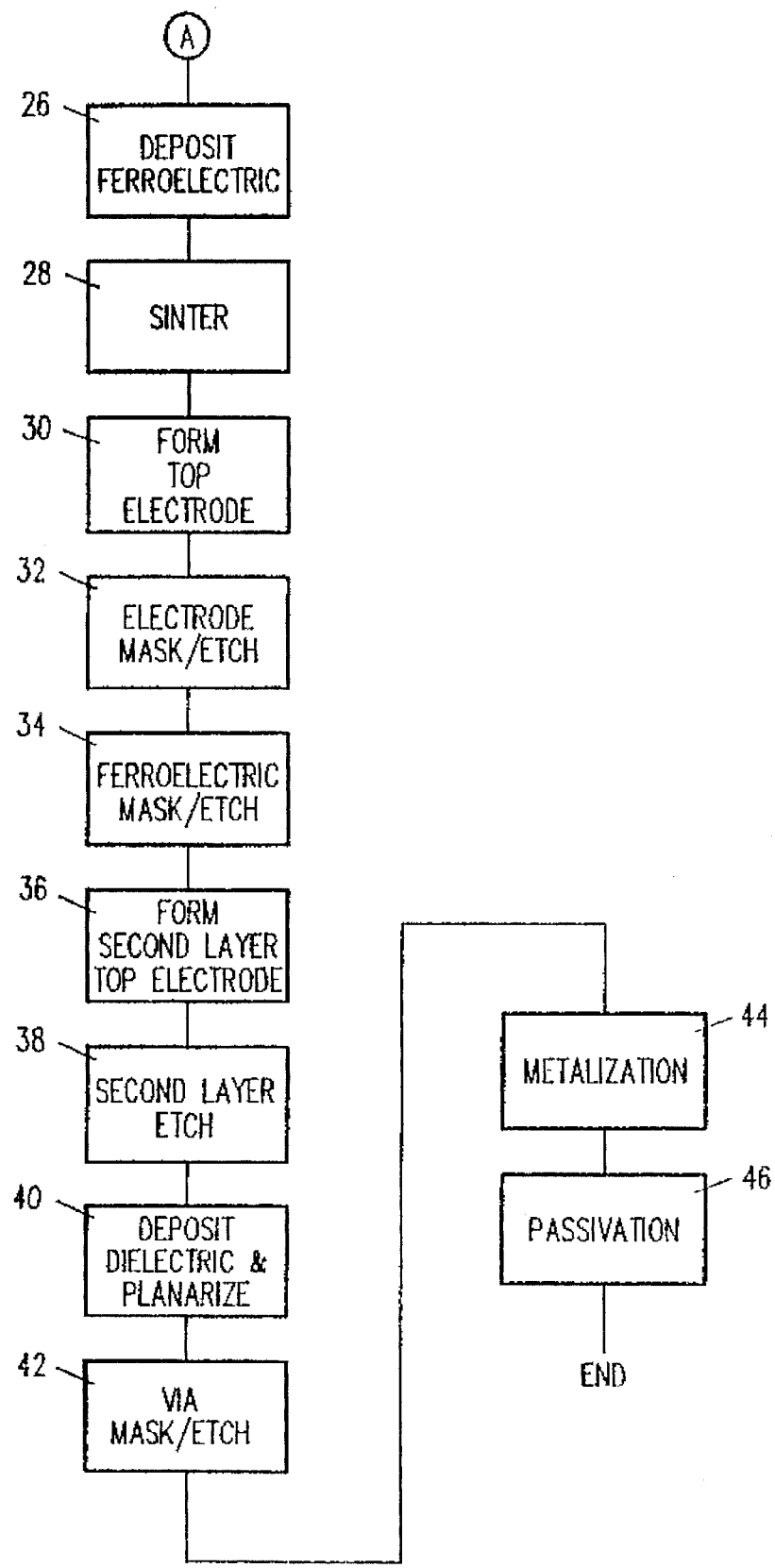

FIGS. 1a and 1b show a standard process flow into which various process modules can be inserted to build ferroelectric capacitors in accordance with the present invention. It should be recognized, however, that ferroelectric material is merely one example from the class of materials which are termed electrical ceramic oxides, and the present invention contemplates the formation of barriers for reactive electrical ceramic oxides in general, rather than being limited only to ferroelectrics. Thus, for all embodiments of the invention described below, steps 10–16 are performed. Then, the steps in either module A, module B, or module C may be performed to obtain one of desired ferroelectric capacitor structures. Finally, steps 26–46 are performed to complete the process.

The process indicated in steps 10–16 is described with reference to FIG. 2, where a portion of a typical MOS memory device 110 showing two n-channel transistors sharing a common drain and formed between field oxide regions 112 is illustrated. A p-type semiconductor substrate 108 has a first n-type drain region 114, a common n-type source region 116, and a second n-type drain region 118 formed therein by conventional techniques. The substrate is then covered by a thin gate oxide layer 120. A pair of polysilicon gates 124, 126 are formed by depositing polysilicon over the gate oxide 120, patterning the polysilicon, and covering the polysilicon with a dielectric layer 122, such as silicon dioxide.

Figure 2:
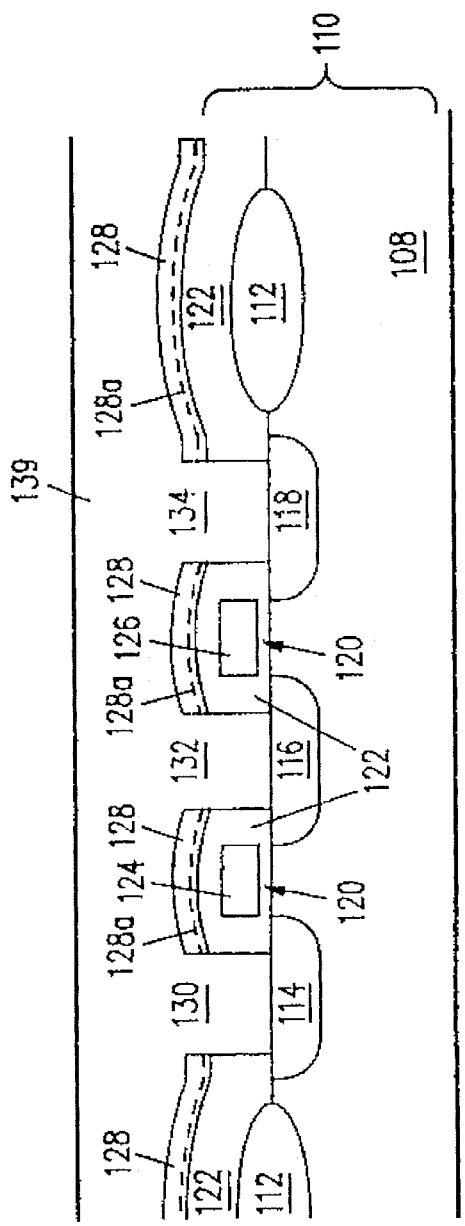

Since the steps required to obtain the MOS structure 110 of FIG. 2 are conventional, they need not be discussed in detail herein. It is the remainder of the process steps that define the present invention. It is to be recognized that the present invention is not limited to MOS architectures, but has applicability to integrated circuits in general. It should be noted, however, that gallium arsenide constructions would be more difficult to obtain because of the high temperature steps required to fabricate a ferroelectric capacitor.

With continuing reference to FIG. 2, according to the present invention, after formation of the silicon dioxide layer 122, titanium dioxide barrier regions 128 are formed by depositing approximately 1000Å to 2000Å of titanium over the dielectric layer 122 at a low temperature (less than 400° C.) and oxidizing the titanium at 450° C. to 850° C. for thirty minutes. As will be described in greater detail below, the barrier regions 128 protect the underlying MOS structure 110 from being altered by subsequent process steps. It may be necessary to deposit a layer of silicon nitride 128a in the range of 500Å to 2000Å before the titanium to ensure that barrier regions 128 are truly impervious to the subsequent process steps. The titanium/silicon nitride is then masked and etched to define contact windows 130, 132, 134 to the first drain 114, common source 116, and second drain 118, respectively. A layer 139 of refractory metal is then deposited by known methods in order to fill the gaps between the contacts. The refractory metal must be capable of surviving the subsequent high temperature steps intact. Tungsten is preferred. It may be necessary to make the metal layer 139 thicker than would be required for a standard process without the ferroelectric process to allow for additional planarization of the metal.

In accordance with the preferred embodiment of the present invention, a vertical ferroelectric capacitor is made over the above-described structure by following the steps outlined in module B of FIG. 1a.

Figure 3:
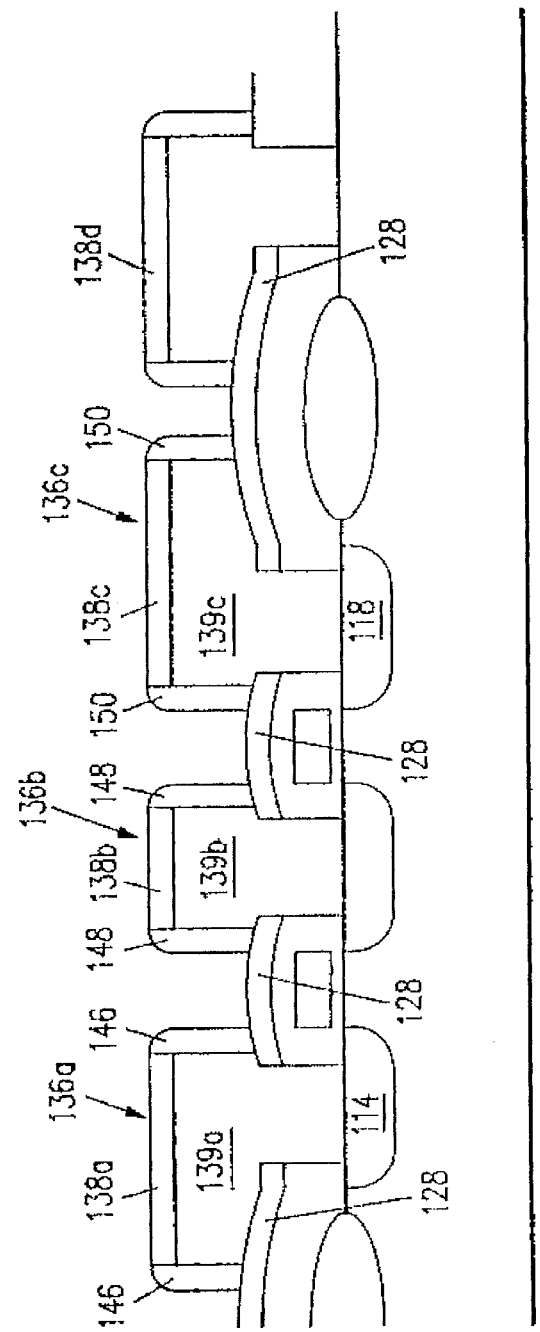

Referring to FIG. 1a and to FIG. 3, to prevent the refractory metal from interacting with the ferroelectric material which is deposited in a subsequent step, a reaction barrier 138 is formed by sputtering ruthenium over the refractory metal layer 139. A layer of titanium may be used as a hard mask to pattern the ruthenium. The titanium is masked and etched. Then the reaction barrier 138 is sputter etched to define the ruthenium barrier electrodes 138a, 138b, 138c, 138d. The tungsten is then etched through a hard mask, and the barrier regions 128 serve as an etch stop, such that contact plugs 136a, 136b, 136c, 136d are formed having barrier electrodes 138a, 138b, 138c, 138d on top of metal contacts 139a, 139b, 139c, 139d. The titanium hard mask is stripped before the ferroelectric is deposited. The barrier electrodes 138a, 138c above drain regions 114, 118 comprise the bottom electrodes of two vertical ferroelectric capacitors. It should be noted that contact plug 136d corresponds to contact plug 136a in that symmetry of construction allows two series capacitors to be conveniently built above each field oxide region.

It is necessary to protect the exposed sides of contact plugs 136a, 136b, 136c, 136d to prevent the exposed refractory metal from reacting with the ferroelectric material. Thus, spacers 146, 148, 150 are formed by depositing titanium over the plugs 136a, 136b, 136c. Alternatively, it may be possible to reactively sputter titanium dioxide to form the spacers 146, 148, 150. The titanium is then etched anisotropically to remove it from the top of the plugs 136a, 136b, 136c and from the top of the barrier regions 128 leaving spacers 146, 148, 150 only on the sides of the plugs 136a, 136b, 136c to protect the refractory metal. This is a critical step, since any residue from the spacer etch may affect the interface between the bottom electrodes 138a, 138c and the ferroelectric material.

Figure 4A:
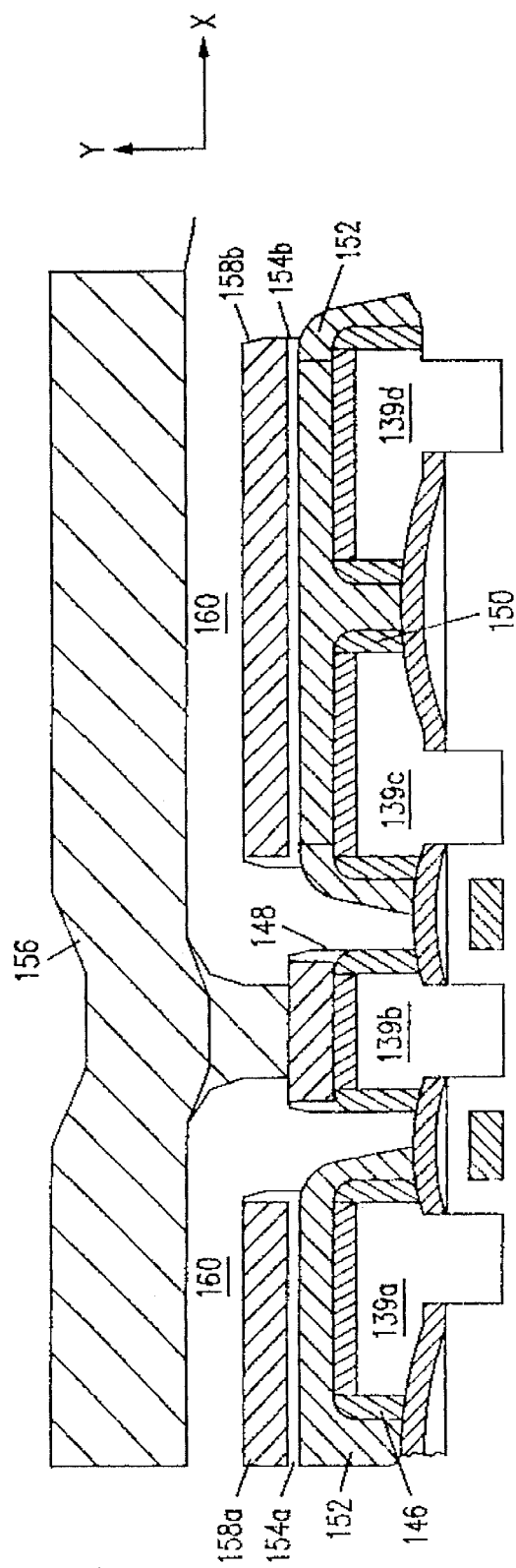

The process flow now leaves module B of FIG. 1a and returns to the standard process to perform steps 26 through 46, as shown in FIG. 1b. As shown in FIG. 4a, after spacers 146, 148, 150 have been formed, a ferroelectric material 152, such as PZT, is deposited via a spin-on process or by chemical vapor deposition. The device is then sintered by furnace or rapid thermal processing at temperatures of 450° C.–850° C. During the sinter step, the ruthenium and the titanium are oxidized, but the tungsten is not affected. Thus, the spacers 146, 148, 150 are converted to titanium dioxide. The top electrodes 154a, 154b are formed by depositing a layer of ruthenium over the contact plugs 139a, 139c, 139d and patterned by using a titanium hard mask.

The top electrodes 154a, 154b are then masked and etched. The exposed ferroelectric material 152 must also be etched. The target dimension for the ferroelectric etch is for 1 micron holes with a 0.3 micron undercut.

In order to prevent an oxidation reaction between the ruthenium and the aluminum contact 156, second top electrodes 158a, 158b are formed over the top of the first electrodes 154a, 154b. The second top electrodes 158a, 158b may be a single layer of ruthenium, or aluminum over ruthenium, or titanium over aluminum over ruthenium. The thickness depends on whether or not this layer is to be used by the designer as an extra interconnect layer to carry large currents. For large currents, the aluminum would be used, making later planarization more difficult. If the extra interconnect layer is not needed, only a thin layer of ruthenium is needed, which will make it easier to pattern the layer and cover it later with dielectric. The second top electrodes 154a, 154b must be etched to clear out the valleys between plugs 139a, 139b, 139c.

A second dielectric layer 160 is deposited and planarized. Only a small class of oxides are effective over ferroelectric materials, such as APCVD or low temperature vacuum processes like ECR deposition. Generally, the profile of the first dielectric layer 122 is reproduced, but additional deposition and planarization may be required. The second dielectric layer 122 is masked and etched to create a tapered via for the deposit of metal contact 156, typically aluminum.

To complete the device, a passivation layer is deposited over the entire device, then masked and etched to provide for external connection to the device, in accordance with conventional procedures therefor.

Figure 4C:
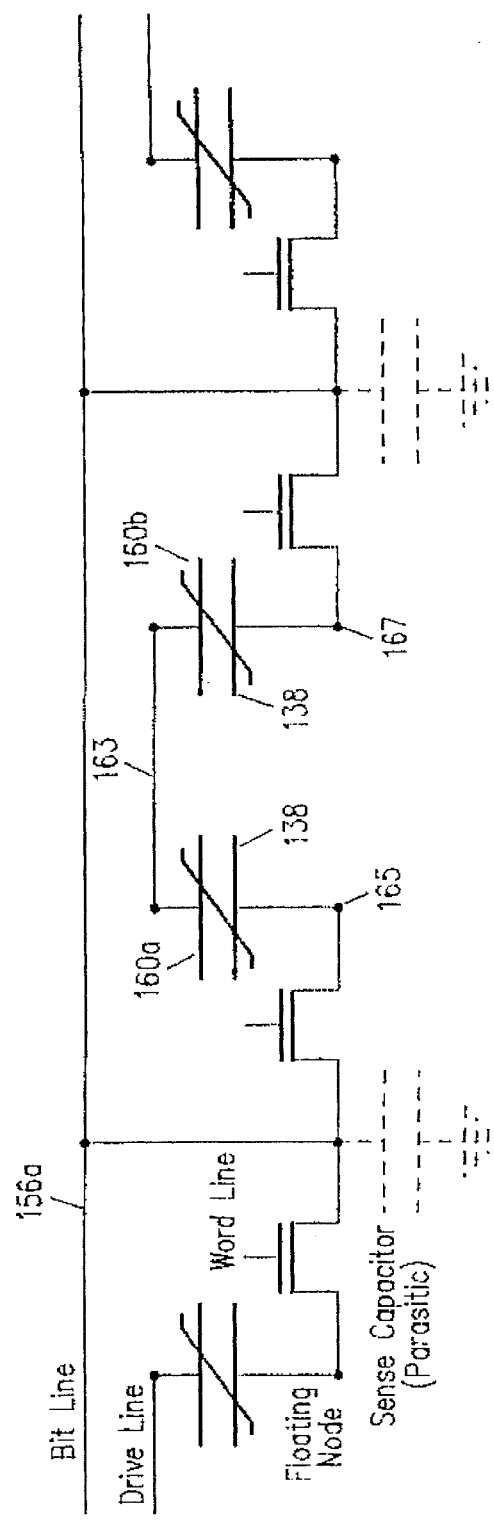
Figure 4B:
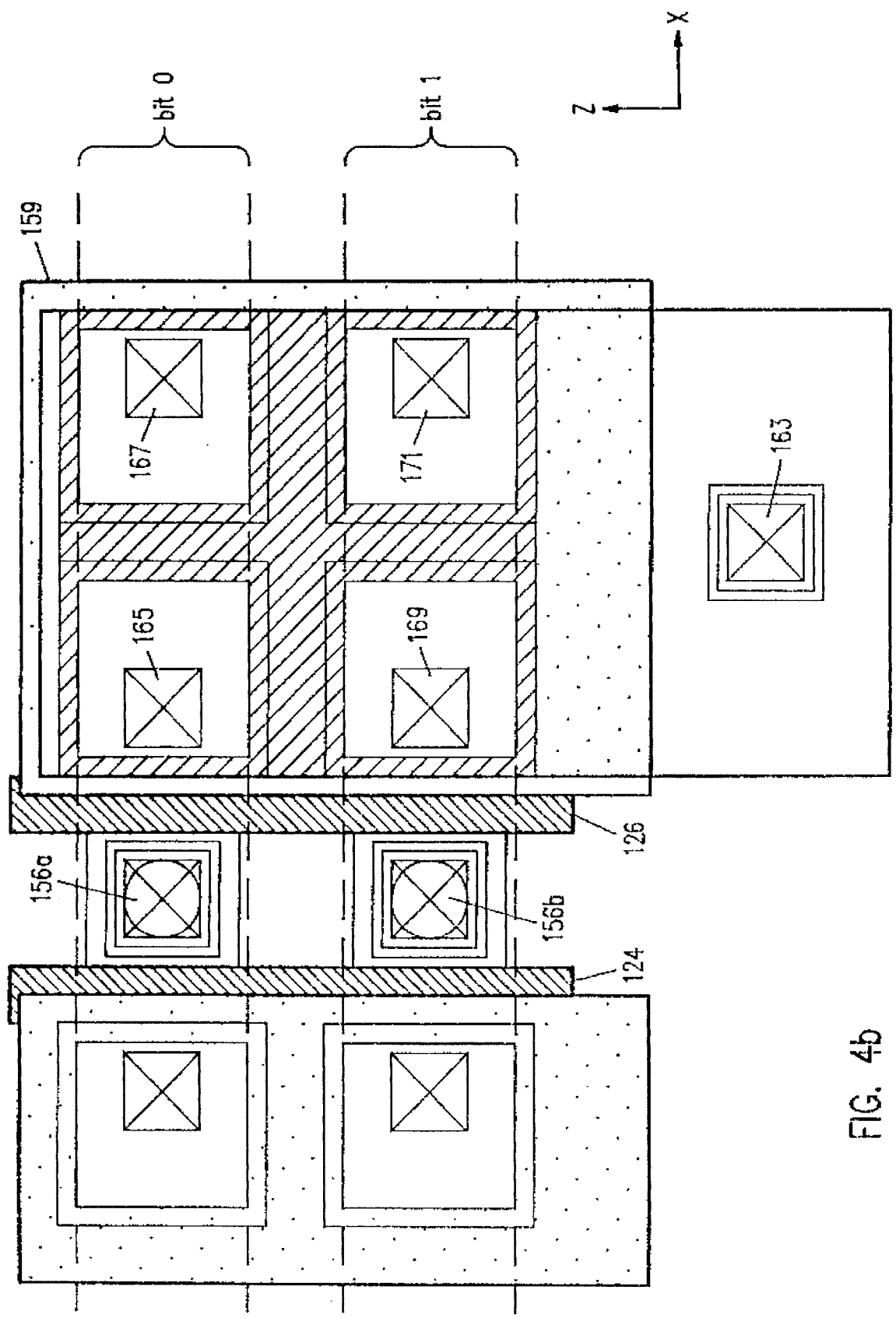
FIG. 4b is a top plan view of a particularly preferred construction of a vertical ferroelectric capacitor.

In a particularly preferred construction, shown in the top plan view of FIG. 4b, two parallel circuit features are formed which represent, for example, bit 0 and bit 1 lines in a typical memory configuration. The corresponding electrical schematic for one of the bit lines is shown in FIG. 4c. Contact to the bit lines is provided at points 156a, 156b. Due to symmetry surrounding the bit lines, two capacitors 160a and 160b share a common bit line, bit 0, and two capacitors 161a, 161b share a common bit line, bit 1. Contact to the top electrode of any of the capacitors is at point 163. Contact to the bottom electrode of each capacitor 160a, 160b, 161a, 161b is made at points 165, 167, 169, 171 respectively. It can be seen that additional memory elements may be constructed in similar fashion along both the x- and z-axes.

An alternative embodiment of a vertical ferroelectric capacitor can be made according to the steps outlined in process module A of FIG. 1a.

Figure 5:
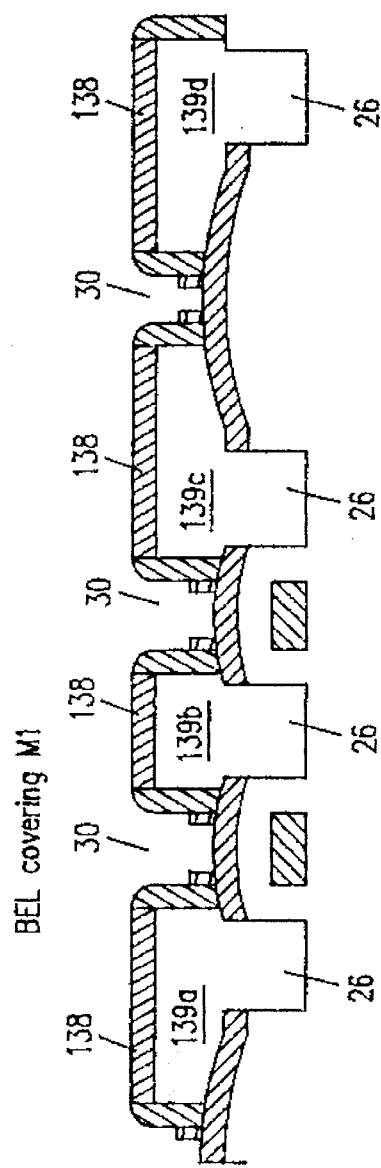
FIG. 5 is a side plan view of an alternative embodiment of a vertical ferroelectric capacitor according to the present invention.

Referring to FIG. 5, in this embodiment, process steps 10–16 are as described above. However, the metal layer is masked and etched to define the contact plugs 139a, 139b, 139c before the reaction barrier 138 is deposited. The reaction barrier 138 is formed by depositing ruthenium, then masking and etching to create a 0.1 micron overlap of the metal region, thus adding 0.3 microns in the bit line direction, and 0.2 microns along the drive line for alignment tolerances. The remainder of the process steps are as described above with reference to the first embodiment of the invention.

The advantage of the second embodiment is that no spacers are used, thus all processing steps are known and conventional. The hazard associated with forming the device according to the second embodiment is that thinning will occur at the edges of the metal deposit step. A spacer could be incorporated to help avoid thinning, and in this geometry, a spacer would not be as critical for use as a barrier as in the first embodiment. The use of a spacer would, however, take up additional space on the chip.

A third embodiment of a vertical ferroelectric capacitor can be made according to the process steps in module C of FIG. 1a. Again, process steps 10–16 are as described above.

Figure 6:
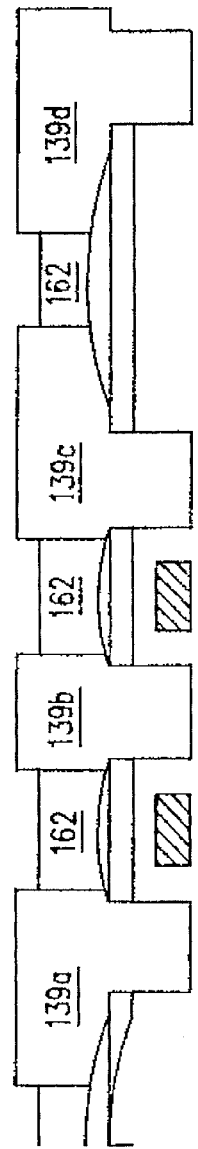
FIGS. 6–8 are side plan views of a third embodiment of a vertical ferroelectric capacitor according to the present invention.
Figure 7:
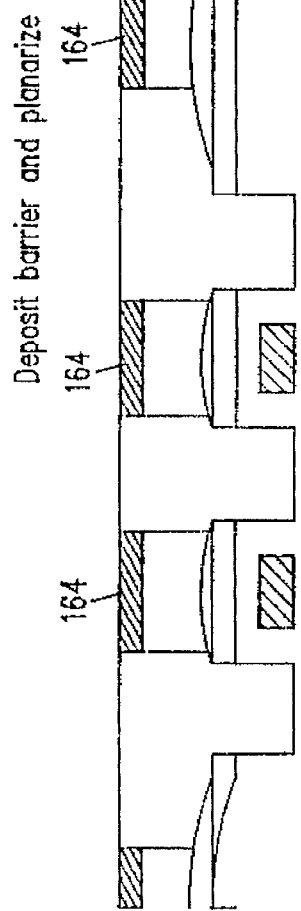
Figure 8:
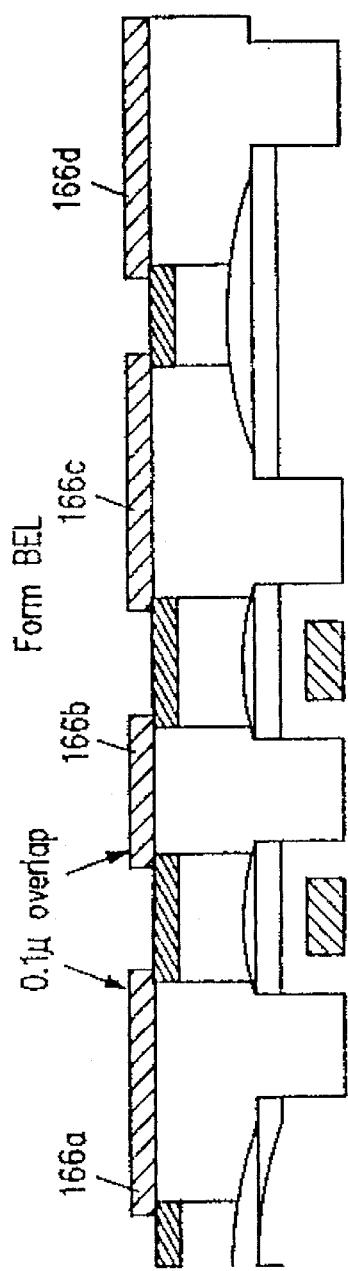

Referring to FIGS. 6–8, the deposited tungsten is masked and etched to create metal contacts 139a, 139b, 139c, 139d as in the second embodiment. Next, an oxide layer 162 is deposited over the tungsten and planarized using well known techniques. The resulting surface is smoothed. An anisotropic oxide etch is then used to reduce the oxide layer 162 below the surface of the tungsten.

A barrier layer 164 is then formed. Preferably, titanium dioxide is reactively sputtered onto the device, but other oxides may be used if they provide adequate electrical isolation. The metal contacts 139a, 139b, 139c, 139d are again planarized and polished to produce a smooth surface with exposed refractory metal on top of metal contacts 139a, 139b, 139c, 139d. The barrier or bottom electrodes 166a, 166b, 166c are then formed by depositing ruthenium and etching such that a 0.1 micron overhang of the metal contacts 139a, 139b, 139c, 139d is created. The remaining process steps are as previously described.

The advantage of the third embodiment is that no spacer is required. The primary disadvantage of the third embodiment is that additional non-uniformities may be introduced to the process as a result of several planarization and etchback steps, thus increasing the cost while decreasing the yield.

According to the present invention, a lateral ferroelectric capacitor may also be constructed by using different masks in the process flow of module B.

Figure 9:
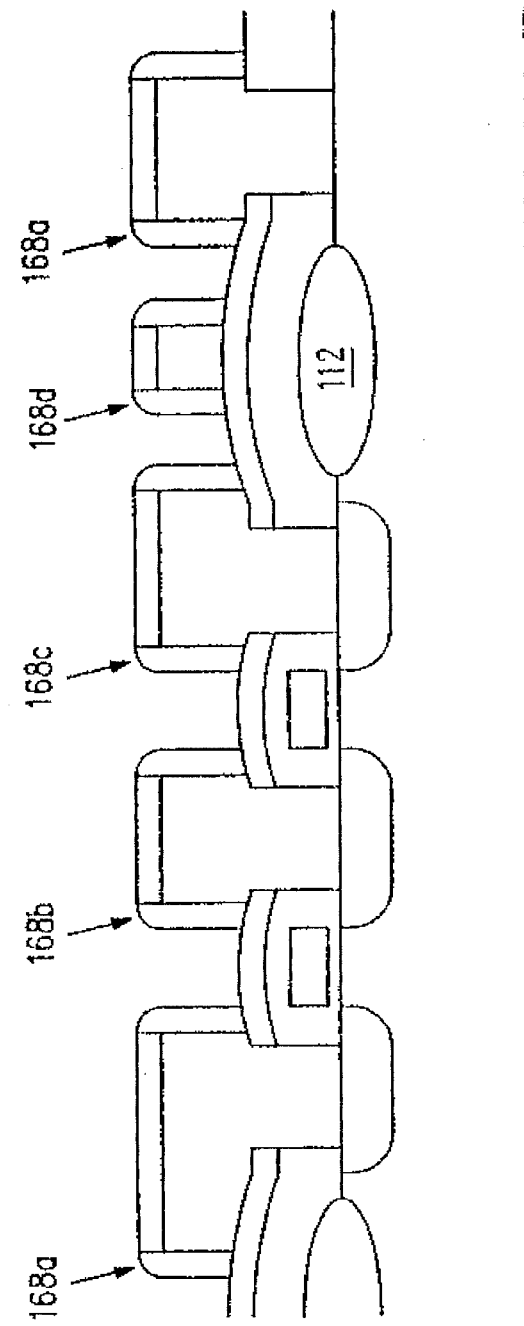

Through step 18, the present embodiment is identical to that of the preferred embodiment. However, with reference to FIG. 9, the metal layer 139 and the reaction barrier 138 are etched to form contact plugs 168a, 168b, 168c, which correspond to plugs 139a, 139b, 139c in the previous vertical embodiments, and an additional contact plug 168d. Note that contact plug 168d is oriented above the field oxide region 112. The process follows module B except that the spacers 172b, 172c, 172d must be made of an electrode material such as ruthenium. A ferroelectric material is then deposited by a known sol-gel technique in order to fill the gaps between the electrode cladded metal plugs 168a, 168c, 168d and leave a thin layer on top of the plugs. The thin layer of ferroelectric material is more easily removed in this structure than in the vertical structures. An additional barrier layer 170 is not necessary, but can be patterned with the same mask as the ferroelectric material and would provide additional isolation of the ferroelectric capacitors. The process continues from here with step 40.

Figure 10C:
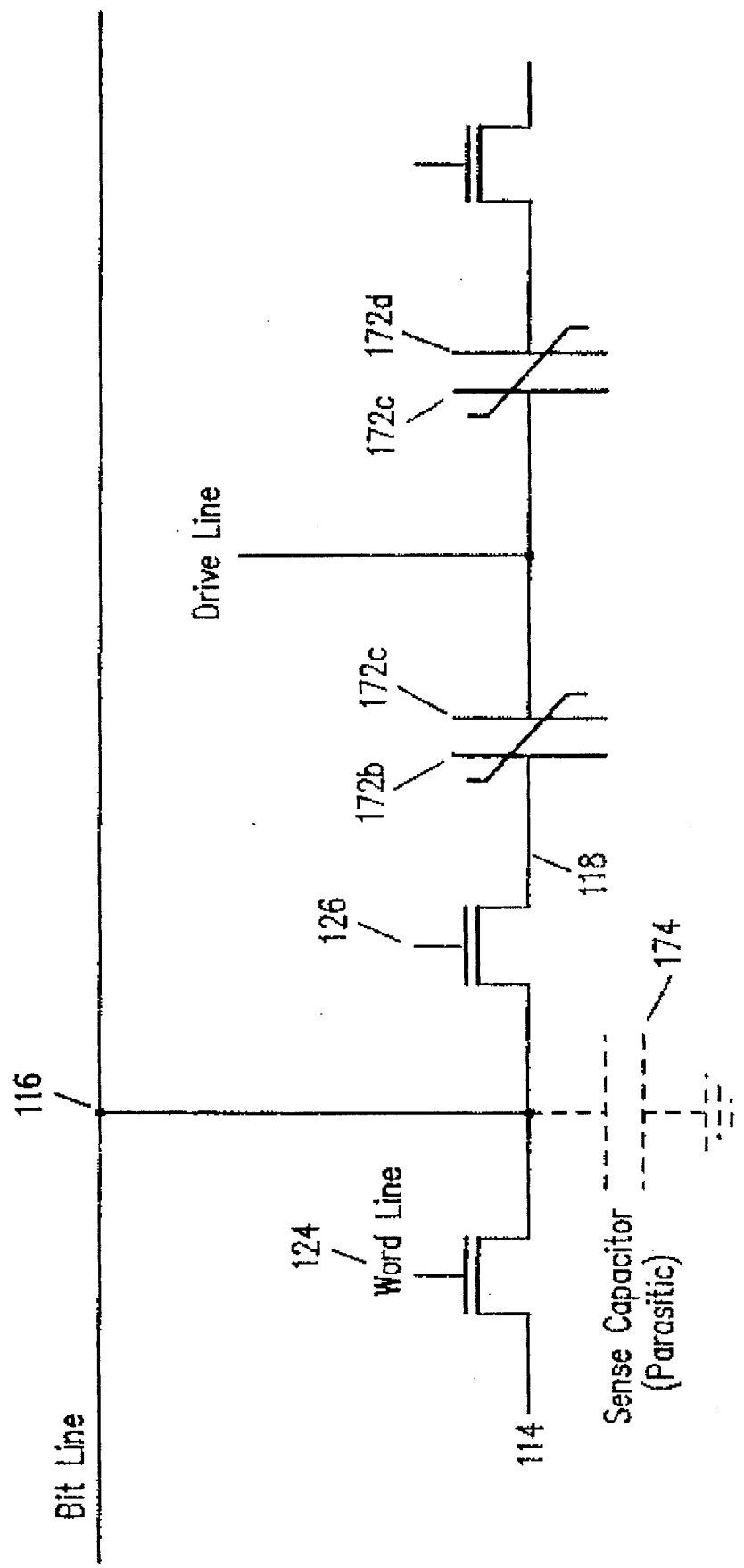

The resulting structure is shown in FIG. 10a, and a particularly preferred two-bit line construction is shown in top plan view in 10b. The corresponding electrical schematic for one of the bit lines is shown in FIG. 10c. As in the vertical configuration, polysilicon gates 124, 126 are the word lines. The aluminum 156 contacts the common source 116, which acts as one of the bit lines.

It should be understood that the present invention is not intended to be limited by the specifics of the above-described embodiments. The scope of the invention is defined by the accompanying claims.

We claim:

1. An electrical ceramic oxide capacitor utilizable in an integrated circuit memory device, wherein at least one active device is isolated by field oxide regions, said active device having active regions including a first drain, a common source, and a second drain spaced-apart in a semiconductor substrate, a thin gate oxide layer on top of the substrate over the active regions, a first gate above the gate oxide layer and positioned between the first drain and common source, a second gate above the gate oxide layer and positioned between the second drain and the common source, and a dielectric layer covering the device, said capacitor comprising:

a. a plurality of diffusion barriers formed over the dielectric layer including a first and a second diffusion barrier above the first and second gates, respectively, and a third and a fourth diffusion barrier above respective field oxide regions;

b. a plurality of metal plugs formed through the diffusion barriers and the dielectric layer, including a first metal plug for contacting the first drain region, a second metal plug for contacting the second drain region, and a third metal plug for contacting the common source region, each of said metal plugs having a top and sides exposed above the diffusion barriers;

c. a pair of bottom electrodes formed on the top of the first and second metal plugs;

d. a pair of top electrodes formed over each of the bottom electrodes; and e. a layer of electrical ceramic oxide material between each top and bottom electrode.

2. The electrical ceramic oxide capacitor of claim 1, wherein the first, second, and third metal plugs are formed with a refractory metal.

3. The electrical ceramic oxide capacitor of claim 2, wherein the refractory metal is tungsten.

4. The electrical ceramic oxide capacitor of claim 1, wherein the bottom electrodes are made of ruthenium.

5. The electrical ceramic oxide capacitor of claim 1, further comprising a pair of protective spacers formed on the sides of the first and second plugs, respectively, between the diffusion barriers and the bottom electrodes.

6. An electrical ceramic oxide capacitor utilizable in an integrated circuit memory device, wherein at least one active device is isolated by field oxide regions, said active device having active regions including a first drain, a common source, and a second drain spaced-apart in a semiconductor substrate, a thin gate oxide layer over the substrate, a first gate above the gate oxide layer and positioned between the first drain and common source, a second gate above the gate oxide layer and positioned between the second drain and the common source, and a dielectric layer covering the device, said capacitor comprising:

a. a plurality of diffusion barriers formed over the dielectric layer, including a first and a second diffusion barrier above the first and second gates, respectively, and a third and a fourth diffusion barrier above respective field oxide regions;

b. a plurality of metal plugs, including a first metal plug formed through the diffusion barriers and the dielectric layer for contacting the first drain, a second metal plug formed through the diffusion barriers and the dielectric layer for contacting the second drain, a third metal plug through the diffusion barriers and the dielectric layer for contacting the common source, and a fourth metal plug above one of the field oxide regions, each of said metal plugs having a top and sides exposed above the diffusion barriers;

c. a plurality of reaction barriers formed on top of each of the metal plugs;

d. a plurality of conductive spacers formed on the sides of each of the metal plugs;

e. a layer of electrical ceramic oxide material formed above the field oxide regions and between selected ones of the conductive spacers; and f. a top barrier formed over the electrical ceramic oxide layer.

7. An electrical ceramic oxide capacitor, comprising:

an integrated circuit device having at least one active region therein;

a dielectric layer formed over the integrated circuit device;

first barrier means formed over the dielectric layer for protecting against diffusion through the dielectric layer;

an interconnect comprised of refractory metal and formed through the first barrier means and the dielectric layer and contacting the active region, said interconnect having a top and sidewalls which are exposed above the first barrier means;

second barrier means formed on the top of the interconnect for protecting the interconnect against reaction with electrical ceramic oxide material and for acting as a first electrode;

third barrier means formed on the sidewalls of the interconnect for protecting the interconnect against reaction with electrical ceramic oxide material;

a layer of electrical ceramic oxide material formed over the first electrode; and a second electrode formed over the layer of electrical ceramic oxide material.

8. An electrical ceramic oxide capacitor formed over a semiconductor integrated circuit memory device having a first active region isolated from a second active region by a field oxide region and a dielectric layer covering the regions, comprising:

a diffusion barrier formed over the dielectric layer, a plurality of interconnects comprised of refractory metal, each of said interconnects having a top and sidewalls which are exposed above the diffusion barrier, including a first interconnect formed through the diffusion barrier and the dielectric layer for contacting the first active region, a second interconnect formed through the diffusion barrier and the dielectric layer for contacting the second active region, and a third interconnect formed on top of the dielectric layer above the field oxide region, a plurality of reaction barriers each formed on the tops of respective interconnects, a plurality of conductive spacers each formed on the sidewalls of respective interconnects, and electrical ceramic oxide material formed over the field oxide region and between each of the interconnects.

\* \* \* \* \*